United States Patent
Joshi

(10) Patent No.: US 8,213,176 B2
(45) Date of Patent: Jul. 3, 2012

(54) SYSTEMS AND METHODS FOR PROVIDING AIRFLOW

(75) Inventor: Shailesh N. Joshi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/047,499

(22) Filed: Mar. 14, 2011

(65) Prior Publication Data

US 2011/0155503 A1 Jun. 30, 2011

Related U.S. Application Data

(62) Division of application No. 12/489,867, filed on Jun. 23, 2009, now Pat. No. 7,929,295.

(51) Int. Cl.
*H05K 7/20* (2006.01)
*E04F 17/04* (2006.01)
*H02K 5/24* (2006.01)

(52) U.S. Cl. ........... 361/679.5; 361/679.46; 361/679.48; 361/692; 361/695; 181/198; 181/200; 181/201; 181/206; 181/224; 454/184; 381/71.1; 381/71.2; 381/71.5; 381/71.7

(58) Field of Classification Search ........... 361/679.46–679.53, 690–697, 361/717–728, 831; 454/184; 165/80.3, 121–126, 165/104.33, 104.34, 185; 181/200–206, 181/198, 224–229, 252–258, 268, 286, 288, 181/290–295; 381/71.1–71.7; 62/259.2; 312/223.2, 223.3, 236
See application file for complete search history.

(56) References Cited

U.S. PATENT DOCUMENTS

| | | | |
|---|---|---|---|
| 5,000,079 A | 3/1991 | Mardis | |
| 5,452,362 A | 9/1995 | Burward-Hoy | |
| 5,526,228 A * | 6/1996 | Dickson et al. | 361/695 |
| 6,086,476 A | 7/2000 | Paquin et al. | |
| 6,104,608 A | 8/2000 | Casinelli et al. | |
| 6,198,627 B1 | 3/2001 | Roehling et al. | |
| 6,222,730 B1 | 4/2001 | Korvenheimo et al. | |
| 6,459,578 B1 | 10/2002 | Wagner | |
| 6,463,230 B1 | 10/2002 | Wargo | |
| 6,481,527 B1 | 11/2002 | French et al. | |
| 6,643,128 B2 | 11/2003 | Chu et al. | |
| 6,745,149 B2 | 6/2004 | Beeten | |
| 6,885,555 B2 | 4/2005 | Greco | |
| 7,161,801 B2 * | 1/2007 | Chen et al. | 361/690 |
| 7,245,489 B2 | 7/2007 | Natsume et al. | |
| 7,283,359 B2 | 10/2007 | Bartell et al. | |
| 7,314,113 B2 * | 1/2008 | Doll | 181/225 |
| 7,352,576 B2 | 4/2008 | McClure | |
| 7,353,908 B1 | 4/2008 | French | |
| 7,359,205 B1 | 4/2008 | Sun et al. | |
| 7,379,298 B2 | 5/2008 | Walsh et al. | |
| 7,382,632 B2 | 6/2008 | Alo et al. | |
| 7,400,501 B2 | 7/2008 | Bartell et al. | |
| 7,459,505 B2 | 12/2008 | Maier et al. | |
| 7,546,898 B2 | 6/2009 | Tracy et al. | |
| 7,549,505 B1 | 6/2009 | Kawar | |
| 7,562,742 B2 | 7/2009 | Gilliland et al. | |
| 7,644,803 B2 | 1/2010 | Hashizume | |
| 7,646,603 B2 | 1/2010 | Bard et al. | |
| 7,712,576 B2 | 5/2010 | Goto et al. | |

(Continued)

*Primary Examiner* — Michail V Datskovskiy

(57) ABSTRACT

An exemplary embodiment of the present invention provides a silencer. The silencer includes an enclosure with a first airflow path configured to allow air to pass through the enclosure and attenuate noise entering the enclosure. The enclosure also includes an opening configured to provide a second airflow path if the first airflow path is obstructed.

20 Claims, 4 Drawing Sheets

U.S. PATENT DOCUMENTS

| | | |
|---|---|---|
| 7,727,059 B2 | 6/2010 | Merino |
| 7,779,960 B2 | 8/2010 | Tang et al. |
| 7,782,612 B2 | 8/2010 | Walsh et al. |
| 7,783,055 B2 * | 8/2010 | Barath et al. .................. 381/71.3 |
| 7,800,895 B2 * | 9/2010 | Inoue et al. .............. 361/679.34 |
| 7,929,295 B2 * | 4/2011 | Joshi .......................... 361/679.5 |
| 8,074,765 B2 * | 12/2011 | Goto et al. .................... 181/225 |
| 2001/0014163 A1 | 8/2001 | Hickman et al. |
| 2007/0110255 A1 | 5/2007 | Barath et al. |
| 2007/0188995 A1 | 8/2007 | Franz et al. |
| 2007/0221440 A1 * | 9/2007 | Gilliland et al. .............. 181/202 |
| 2008/0065245 A1 | 3/2008 | Tang et al. |
| 2008/0078611 A1 | 4/2008 | Inoue et al. |
| 2008/0186668 A1 | 8/2008 | Naufel et al. |
| 2008/0245607 A1 * | 10/2008 | Gilliland et al. .............. 181/280 |
| 2008/0251911 A1 | 10/2008 | Farnsworth et al. |
| 2008/0257639 A1 | 10/2008 | Yamaguchi et al. |
| 2009/0059515 A1 | 3/2009 | Tsakanikas |
| 2009/0103414 A1 | 4/2009 | Joshi et al. |
| 2009/0129000 A1 | 5/2009 | Hoeft et al. |
| 2009/0201640 A1 | 8/2009 | Bard et al. |
| 2010/0056036 A1 | 3/2010 | Nobile |
| 2010/0258377 A1 | 10/2010 | Cash et al. |

* cited by examiner

SYSTEMS AND METHODS FOR PROVIDING AIRFLOW

CROSS-REFERENCE TO RELATED APPLICATION

This application is a divisional of U.S. patent application Ser. No. 12/489,867, filed Jun. 23, 2009 now U.S. Pat. No. 7,929,295.

BACKGROUND

Modern electronic devices, such as personal computers ("PCs"), servers, and disk arrays, among others, often contain densely packed heat-producing components, such as processors, storage devices, power supplies, and the like. To prevent overheating, computer system enclosures often include fans for providing a flow of cooling air through the enclosure that draws heat from various electronic components and transfers the heat to the outside environment. However, if an air outlet becomes blocked, the flow of air may be interrupted and heat may build up inside the enclosure, which may lead to overheating of electronic components. Fans and other electronic components within the enclosure can also be a significant source of environmental noise.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Exemplary embodiments of the present invention relate to systems and methods for providing airflow in a computer system. An exemplary embodiment provides a computing system that includes an enclosure with fans that provide airflow through the enclosure to cool the electronics of the computing system. After the air is drawn through the enclosure, the air exits the enclosure through a silencer that reduces noise produced within the enclosure, for example, by the fans. Inside the silencer, the air flows through a first airflow path surrounded by sound absorption material and includes a first air outlet disposed at a rearward facing surface of the silencer. If the first airflow path becomes obstructed, a second airflow path may be opened to enable the enclosure to continue receiving cool air. In an exemplary embodiment of the present invention, the second airflow path may include an auxiliary air outlet disposed on another surface of the enclosure. The second airflow path may be activated by opening a panel disposed over the auxiliary air outlet. For example, the increased air pressure inside the silencer due to the blockage of the first exhaust may force the panel to open. Exemplary embodiments of the present invention may be used in any suitable electronic device, for example, a disk array, a personal computer, a blade server or the like.

Figure 1:
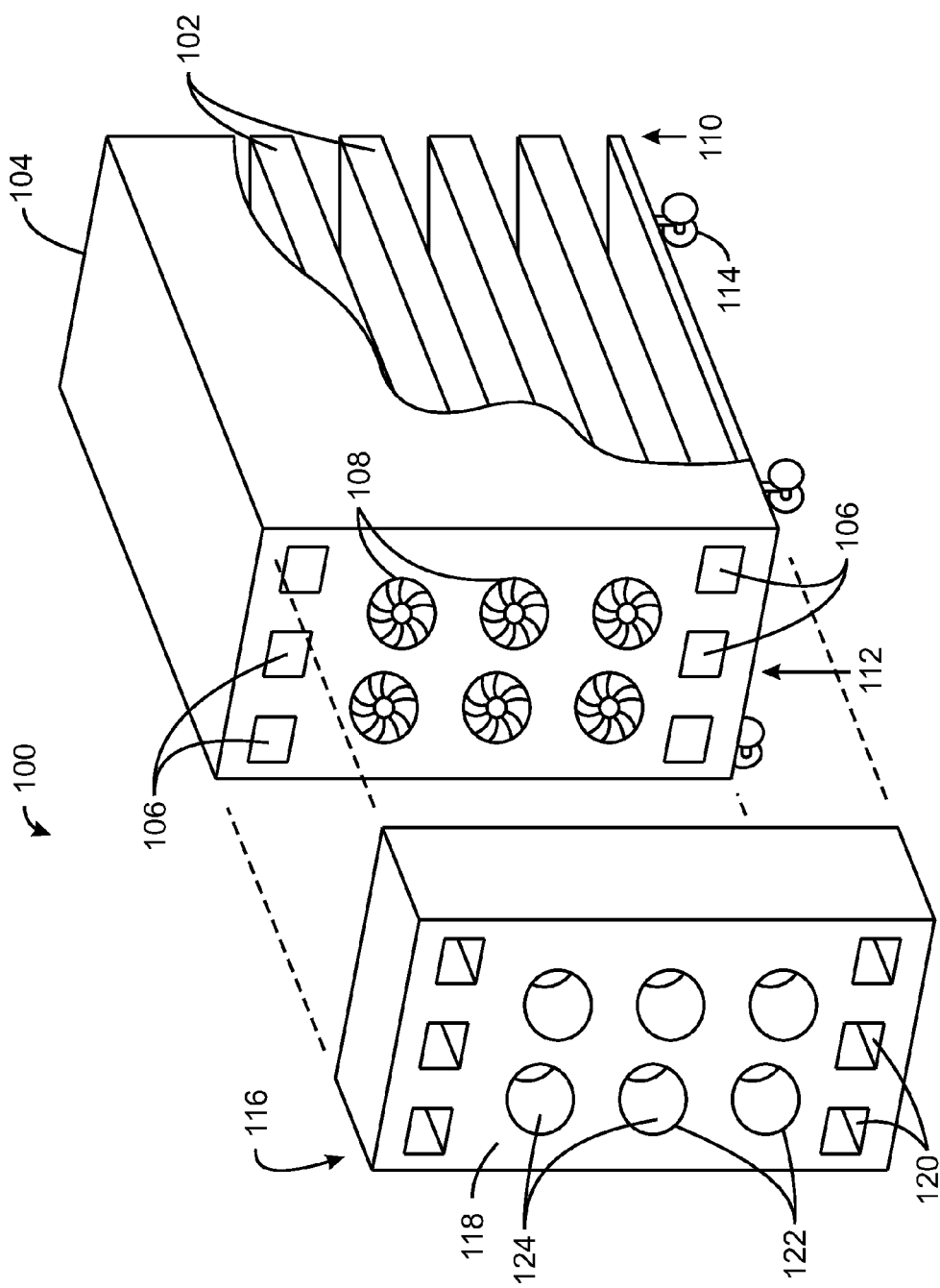
FIG. 1 is a partial cutaway perspective view of a blade system with a silencer, in accordance with exemplary embodiments of the present invention.

FIG. 1 is a partial cutaway perspective view of a blade system 100 with a silencer, in accordance with exemplary embodiments of the present invention. The blade system 100 may include one or more computing blades 102 mounted inside a blade enclosure 104. The blades 102 may include any kind of blade, for example, server blades, switching blades, routing blades, storage blades, and the like. The blade enclosure 104 houses the blades 102 and may provide various functions of the blade system 100, for example, providing power to the blades 102, networking the blades 102 to one another and to external devices, and cooling.

The blade enclosure 104 may include power receptacles 106 for coupling the blade system 100 to a power source such as an alternating-current (AC) power source. The blade system 100 may further include one or more power supply units (PSUs) that receive AC power through the power receptacle 106 and convert the AC power to direct-current (DC) power. The blade system 100 may also include circuitry for distributing the DC power from the PSUs to the one or more blades 102. Moreover, the blade enclosure 104 may include one or more fans 108 that draw cooling air into the blade enclosure 104 to cool the blade 102 electronics.

The enclosure 104 may be open at the front 110 to enable the blades 102 to be easily inserted and removed and to provide user access to the blade's 102 controls, communications ports, status indicators, and the like. The fans 108 may be mounted at the rear 112 of the blade enclosure 104. Further, the blade enclosure may include supports 114 mounted to the bottom of the enclosure. The supports 114 may be wheels configured to increase the portability of the blade enclosure 104. Although, the blade enclosure 104 shown in FIG. 1 is a tower-style enclosure, it will be appreciated that the blade enclosure 104 may also be configured as a rack-mount enclosure.

In an exemplary embodiment of the present invention, the blade system 100 may include a silencer 116 that enables exhaust air to exit the blade system 100 while also reducing the amount of noise produced by blade system 100. The silencer 116 may include an enclosure 118 with receptacle openings 120 and fan openings 122. The silencer mounts to the rear 112 of the blade enclosure 104 such that the receptacle openings 120 align with the power receptacles 106 and the fan openings 122 align with the fans 108. The receptacle openings 120 provide access to the power receptacles 106 through the silencer 116. The fan openings 122 provide an air-path through the silencer 116 that enables exhaust air to exit the blade enclosure 104.

The silencer 116 also includes sound absorbing material 124 disposed on an inside wall of the fan openings 122 and configured to attenuate noise generated in the blade enclosure 104. The sound absorbing material may include, for example, foam, a mesh of fibrous material, a metal mesh, a plastic mesh, or a combination thereof. In some exemplary embodiments of the present invention, the silencer 116 may be included in the blade enclosure 104 rather than mounted to the blade enclosure 104 as a separated piece.

It will be appreciated that, if the fan openings 122 become obstructed, the amount of air flowing through the blade enclosure 104 may be reduced. Therefore, to prevent overheating of the blades 102 that may otherwise result from a blockage of the fan openings 122, the silencer 116 may include an auxiliary air outlet that enables air to pass through the silencer 116 if the fan openings 122 become obstructed, as will be discussed further in reference to FIGS. 2 and 3. This auxiliary air outlet provides an alternate airflow path that may be activated by an increased air pressure within the silencer 116. In this way, cooling air may continue to flow through the blade enclosure 102, and the probability of overheating may be reduced.

Figure 2:
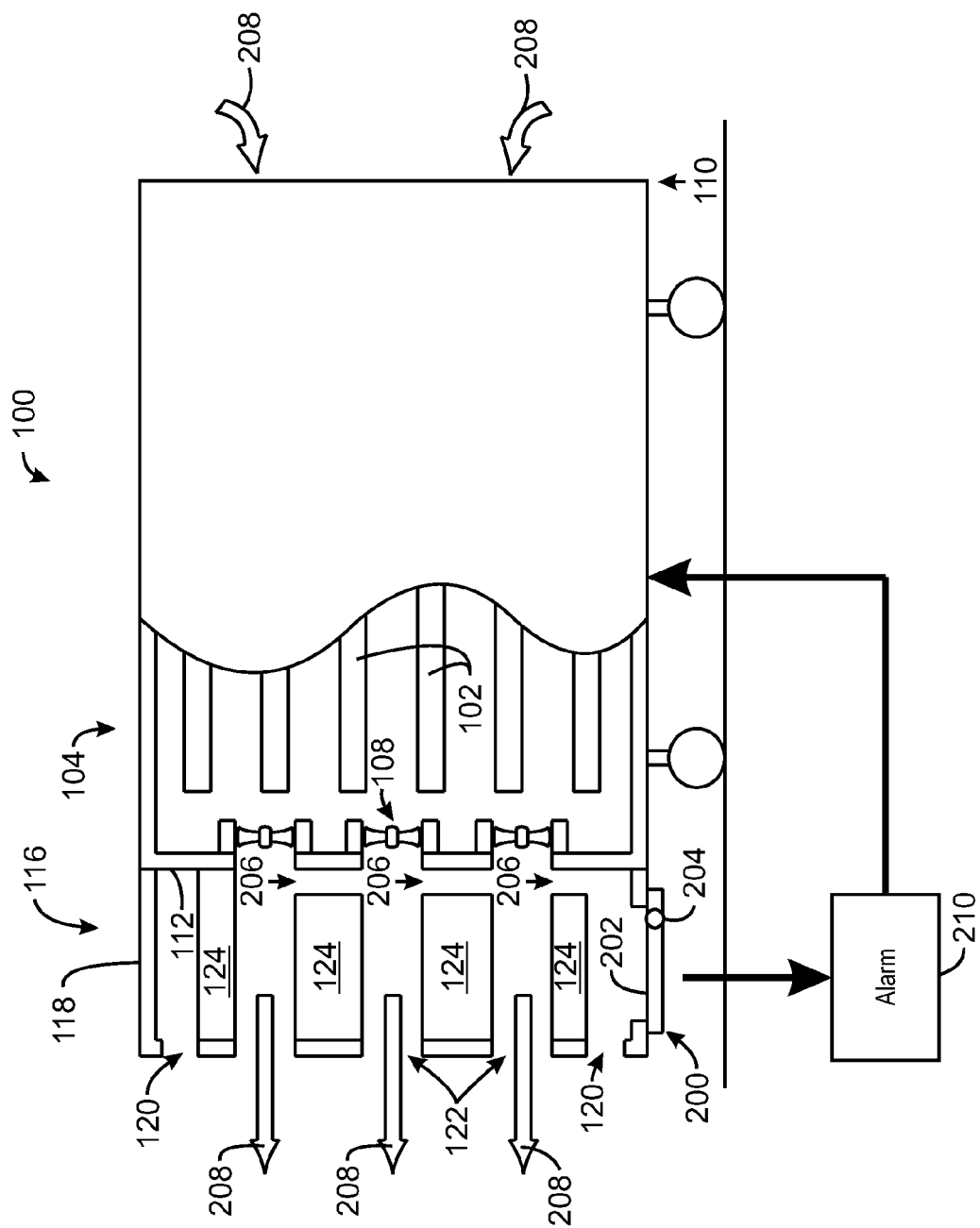
FIG. 2 is a partial cutaway side view of the blade system of FIG. 1 with an auxiliary air outlet, in accordance with exemplary embodiments of the present invention.

FIG. 2 is a partial cutaway side view of the blade system of FIG. 1 with an auxiliary outlet, in accordance with exemplary embodiments of the present invention. As discussed in reference to FIG. 1, the blade system 100 includes a blade enclosure 104 with fans 108 for circulating air through the blade enclosure 104 and a silencer 116 with fan openings 122 aligned with fans the 108 and configured to attenuate noise. In exemplary embodiments of the present invention, the silencer 118 includes an auxiliary air outlet 200 configured to provide an alternate airflow path if the fan openings 122 become obstructed. The auxiliary air outlet 200 may be disposed on any side of the silencer enclosure 118. In some exemplary embodiments, the auxiliary air outlet 200 may be disposed on a side of the silencer enclosure 118 that is perpendicular to the side of the silencer enclosure 118 that has the fan openings 122. In this way, the probability of blocking both the fan openings 122 and the auxiliary air outlet 200 may be reduced. Additionally, multiple auxiliary air outlets 200 may be disposed on opposing sides of the silencer 116.

Furthermore, the auxiliary air outlet 200 may include a panel 202 that covers the auxiliary air outlet 200 and enables the outlet 200 to be opened or closed. In exemplary embodiments, the panel 202 may be coupled to the silencer enclosure 118 via a hinge 204. The auxiliary air outlet 200 may be closed if the fan openings 122 are unobstructed and opened if the fan openings 122 are partially or completely obstructed or airflow through the silencer 116 is otherwise restricted. The opening of the auxiliary air outlet 200 activates the alternate airflow path of the silencer 116.

The alternate airflow path bypasses the fan openings 122 and couples the fans 108 to the auxiliary air outlet 200. The alternate airflow path may be provided, in part, by a vertical channel disposed between the silencer 116 and the rear 112 of the blade enclosure 104. In exemplary embodiments, the vertical channel may be formed by air gaps 206 between the sound absorbing material 124 and the rear 112 of the blade enclosure 104. The gaps 206 may be sized to provide suitable airflow from the fan 108 to the auxiliary air outlet 200. Accordingly, it will be appreciated that the width of the gaps 206 may increase according to the number of fans upstream from the gap 206.

In exemplary embodiments of the present invention, the auxiliary air outlet 200 may be coupled to an alarm 210, which may be triggered by the opening of the auxiliary air outlet 200. For example, the movement of the panel 202 away from the silencer enclosure 118 may cause an interruption of an electrical connection disposed between the panel 202 and the enclosure 118. In other embodiments, the movement of the panel 202 may cause a switch to be depressed.

Triggering the alarm 210 may cause the alarm 210 to generate a warning signal. In some exemplary embodiments, the warning signal may include an audible tone generated by the alarm. In other exemplary embodiments, the warning signal may include illuminating a light, for example, a light emitting diode (LED) disposed at the front 110 of the blade enclosure 104. Generating a warning signal may also include generating an electronic warning message that may be sent to a user through a network. Accordingly, the alarm 210 may send an electrical signal to the blade system 100 that causes the blade system 100 to generate a warning message, such as a text message. The warning message may be sent to a specified device via the network to which the blade system 100 is coupled. For example, the warning message may be sent to a user's email account, instant messaging service, cell phone, pager, and the like.

In exemplary embodiments of the present invention, opening the outlet 200 may be triggered by the air pressure inside the silencer 116. FIG. 2 depicts the silencer with the auxiliary outlet 200 closed and the fan openings 122 unobstructed. Under this condition, the fans 108 draw air 208 into the blade enclosure 104 from the front 110 of the blade enclosure 104. The cooling air 208 flows over the electronics disposed on the blades 102 and exits the blade enclosure 104 through the fans 108. The air 208 then flows through the fan openings 122 of the silencer 116. Accordingly, the air pressure inside the silencer 116 will be close or equal to the air pressure outside the silencer 116, and the auxiliary outlet 200 will remain closed. However, if the fan openings 122 become partially or completely blocked, the air pressure inside the silencer 116 may increase, causing the auxiliary air outlet 200 to open, as described in reference to FIG. 3.

Figure 3:
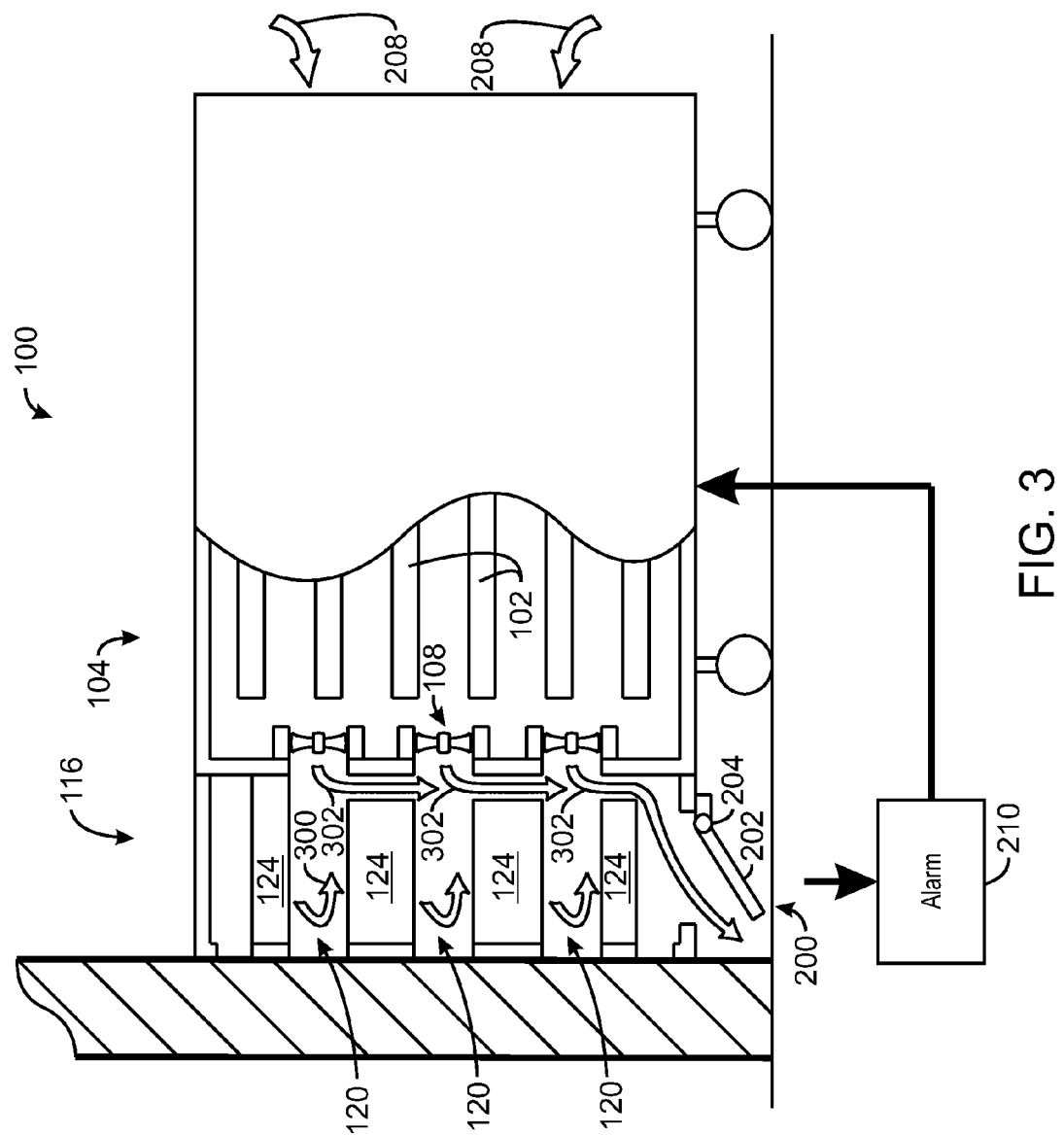
FIG. 3 is a partial cutaway side view of a blade system of FIG. 1 wherein the auxiliary air outlet is open, in accordance with exemplary embodiments of the present invention.

FIG. 3 is a partial cutaway side view of the blade system of FIG. 1 wherein the auxiliary air outlet 200 is open, in accordance with exemplary embodiments of the present invention. As shown in FIG. 3, the blade system 100 has been positioned against a wall or some other obstruction, so that the fan openings 122 are substantially blocked. The air blown by the fans 108 cannot exit through the fan openings 122 and therefore circulates within the silencer 116, as indicated by the arrows 300. Thus, the backpressure on the fans 108 increases, which reduces the airflow 208 through the blade enclosure 104. Additionally, the air pressure inside the silencer 116 may also increase substantially. If the air pressure inside the silencer 116 exceeds a certain threshold, the auxiliary air outlet 200 opens, enabling the air to exit the silencer 116 through the alternate airflow path, as indicated by the arrows 302. In this way, the flow of cooling air 208 through the blade enclosure 104 is maintained even if the fan openings 122 are obstructed. In exemplary embodiments of the present invention, the air pressure inside the silencer 116 triggers the auxiliary air outlet 200 to open.

In some exemplary embodiments, the panel 202 may be spring loaded. For example, the hinge 204 may include a spring that biases the panel 202 open or closed. If the spring biases the panel 202 closed, the auxiliary air outlet 200 may open if the air pressure inside the silencer 116 is high enough to overcome the bias of the spring. Furthermore, the degree to which the auxiliary air outlet 200 opens may be proportional to the degree of blockage of the fan openings 122. As the fan openings 122 become increasingly blocked, the air pressure inside the silencer 116 will increase and the auxiliary air outlet 200 will open wider. Conversely, if the fan openings 122 become unblocked, the air pressure inside the silencer 116 will decrease and the auxiliary air outlet 200 may shut again. Accordingly, the auxiliary air outlet 200 may shut automatically in response to the unblocking of the fan openings 108.

In other exemplary embodiments, the auxiliary air outlet 200 may include a detent mechanism that keeps the auxiliary air outlet 200 closed until a certain level of internal air pressure is reached inside the silencer 116. Further, the auxiliary air outlet 200 may also include a spring that biases the panel 202 open. Therefore, the auxiliary air outlet 200 may open when the air pressure inside the silencer 116 plus the bias of the spring is greater than the force used to overcome the detent mechanism. Once triggered, the auxiliary air outlet 200 may stay open until a user remedies the obstruction of the fan openings 122 and closes the auxiliary air outlet 200 manually.

Figure 4:
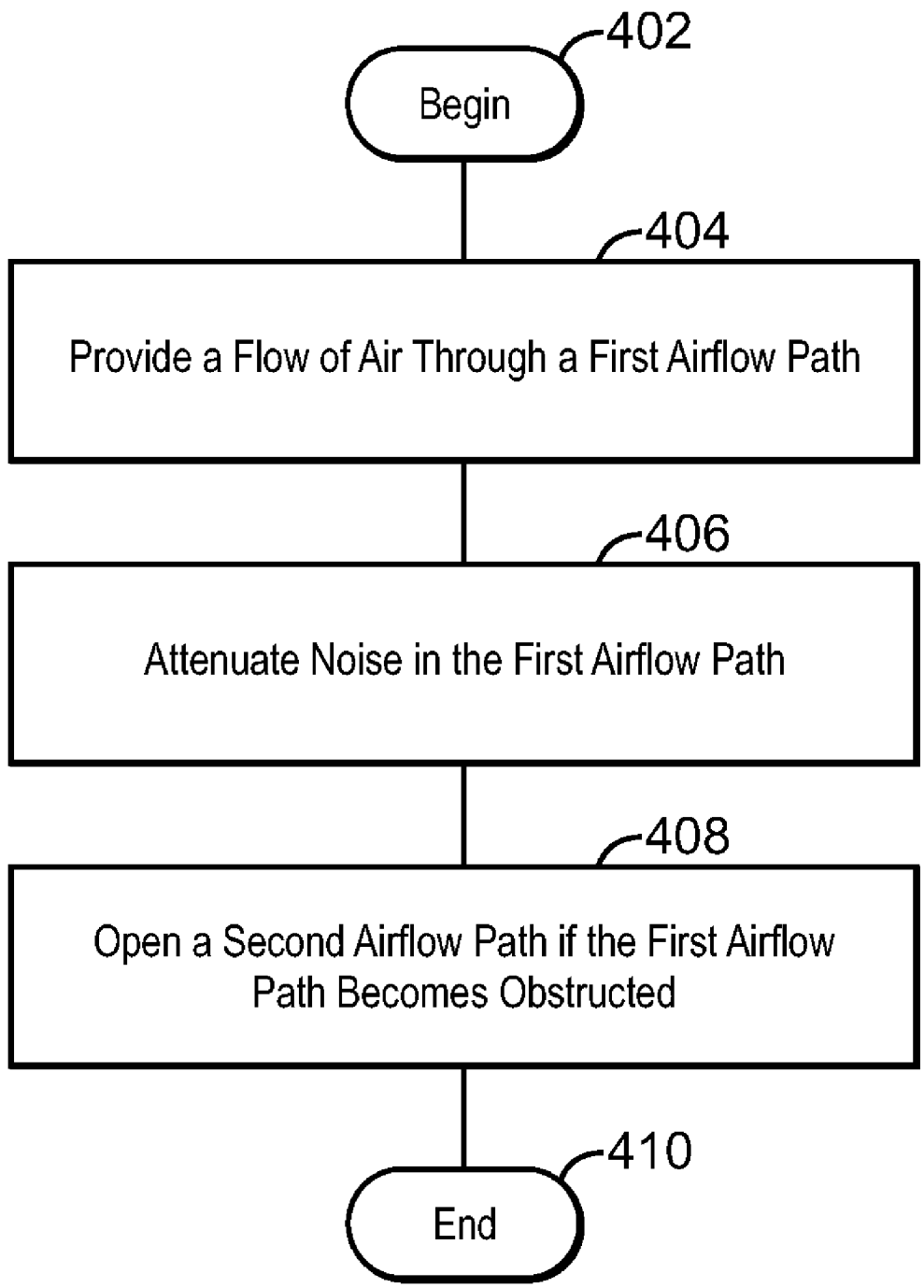
FIG. 4 is a process flow diagram showing a method of cooling an electronic device, in accordance with exemplary embodiments of the present invention.

FIG. 4 is a process flow diagram showing a method of cooling an electronic device, in accordance with exemplary embodiments of the present invention. The method is generally referred to by the reference number 400. At block 402, the method begins.

At block 404, a flow of air through a first airflow path is provided. Noise is attenuated in the first airflow path, as shown at block 406. At block 408, a second airflow path is opened if the first airflow path becomes obstructed. The method ends at block 410.

What is claimed is:

1. A silencer, comprising:
   an enclosure comprising a first airflow path configured to allow air to pass through the enclosure and attenuate noise entering the enclosure; and
   the enclosure further comprising an opening configured to provide a second airflow path if the first airflow path is obstructed.

2. The silencer of claim 1, wherein the second airflow path comprises a channel that couples the first airflow path and the second airflow path.

3. The silencer of claim 1, comprising a panel disposed over the opening and biased toward a closed position.

4. The silencer of claim 3, wherein the panel is configured to open in response to air pressure inside the silencer.

5. The silencer of claim 3, wherein the panel is configured to close automatically if the first airflow path becomes unobstructed.

6. The silencer of claim 1, wherein the silencer is configured to provide an electrical signal to an alarm to indicate whether the panel is open.

7. The silencer of claim 1, wherein the enclosure is configured to mount to a blade enclosure.

8. A blade enclosure comprising:
   a silencer comprising:
      an enclosure mounted to the blade enclosure and comprising a first airflow path configured to allow air to pass through the enclosure and attenuate noise entering the enclosure; and
      the enclosure further comprising an opening configured to provide a second airflow path if the first airflow path is obstructed.

9. The blade enclosure of claim 8, wherein the second airflow path comprises a channel that couples the first airflow path and the second airflow path.

10. The blade enclosure of claim 8, comprising a panel disposed over the opening and biased toward a closed position.

11. The blade enclosure of claim 10, wherein the panel is configured to open in response to air pressure inside the silencer.

12. The blade enclosure of claim 10, wherein the panel is configured to close automatically if the first airflow path becomes unobstructed.

13. The blade enclosure of claim 8, wherein the silencer is configured to provide an electrical signal to an alarm disposed on the blade enclosure to indicate whether the panel is open.

14. A method of attenuating noise in an electronic device, comprising:
   providing a first airflow path configured to allow air to pass through an enclosure and attenuate noise entering the enclosure from the electronic device; and
   providing an opening in the enclosure, the opening configured to provide a second airflow path if the first airflow path is obstructed.

15. The method claim 14, wherein the second airflow path comprises a channel that couples the first airflow path and the second airflow path.

16. The method claim 14, comprising disposing a panel over the opening and biasing the panel toward a closed position.

17. The method claim 16, wherein the panel is configured to open in response to air pressure inside the silencer.

18. The method claim 16, wherein the panel is configured to close automatically if the first airflow path becomes unobstructed.

19. The method claim 14, comprising disposing an alarm on the blade enclosure, the alarm configured to receive an electrical signal that indicates whether the panel is open.

20. The method claim 14, wherein the enclosure is configured to mount to a blade enclosure.

* * * * *

UNITED STATES PATENT AND TRADEMARK OFFICE
CERTIFICATE OF CORRECTION

PATENT NO. : 8,213,176 B2
APPLICATION NO. : 13/047499
DATED : July 3, 2012
INVENTOR(S) : Shailesh N. Joshi It is certified that error appears in the above-identified patent and that said Letters Patent is hereby corrected as shown below:

In column 6, line 24, in Claim 15, delete "method claim" and insert -- method of claim --, therefor.

In column 6, line 27, in Claim 16, delete "method claim" and insert -- method of claim --, therefor.

In column 6, line 30, in Claim 17, delete "method claim" and insert -- method of claim --, therefor.

In column 6, line 32, in Claim 18, delete "method claim" and insert -- method of claim --, therefor.

In column 6, line 35, in Claim 19, delete "method claim" and insert -- method of claim --, therefor, In column 6, line 38, in Claim 20, delete "method claim" and insert -- method of claim --, therefor.

Signed and Sealed this
Twelfth Day of March, 2013

Teresa Stanek Rea
*Acting Director of the United States Patent and Trademark Office*